United States Patent [19]

Gergis et al.

[11] 4,198,690

[45] Apr. 15, 1980

[54] MAGNETIC BUBBLE DOMAIN MEMORY DEVICE WITH INTEGRATED BUFFER

[75] Inventors: Isoris S. Gergis; Thomas T. Chen, both of Yorba Linda, Calif.

[73] Assignee: Rockwell International Corporation, El Segundo, Calif.

[21] Appl. No.: 823,318

[22] Filed: Aug. 10, 1977

[51] Int. Cl.² .............................................. G11C 19/08
[52] U.S. Cl. ......................................... 365/15; 365/17
[58] Field of Search ....................... 365/15, 16, 17, 13, 365/14

[56] References Cited

U.S. PATENT DOCUMENTS

| | | | |
|---|---|---|---|
| 3,737,882 | 6/1973 | Furoya | 365/15 |
| 4,056,812 | 11/1977 | Bobeck et al. | 365/17 |
| 4,079,461 | 3/1978 | George et al. | 365/12 |
| 4,100,608 | 7/1978 | George | 365/17 |

Primary Examiner—James W. Moffitt
Attorney, Agent, or Firm—H. Fredrick Hamann; Daniel R. McGlynn

[57] ABSTRACT

There is disclosed an apparatus and method for constructing integrated buffered devices for use with magnetic bubble domain memories. A small storage loop acts as the buffer memory and is interfaced with the main storage loops through a new circuit component. The new circuit component performs the function of transferring a bubble from one track, holds the bubble for a prescribed number of cycles, and then transfers the bubble to another track. Thus, any arbitrarily located bubble within the storage loop can be transferred to any arbitrary location in the buffer loop.

16 Claims, 4 Drawing Figures

MAGNETIC BUBBLE DOMAIN MEMORY DEVICE WITH INTEGRATED BUFFER

BACKGROUND OF THE INVENTION

1. Field of the Invention

The invention is directed to magnetic bubble domain memory devices, in general, and to magnetic bubble domain memories using an integrated buffer memory, in particular.

2. Prior Art

Buffer memories are used in computer memory hierarchy to improve the flow of data between the mass storage memory and the main memory of the computer. That is, it has been observed that a block of data is likely to be called again shortly after it has been called once before. By retaining the most recently called bocks of data in a buffer memory, the average data flow rate is greatly increased inasmuch as the buffer acts in a time which is much shorter than that of the mass memory. A mass memory is usually of the magnetic recording tape such as discs, drums and the like. On the other hand, the buffer includes memories of the semiconductor or magnetic core type memories.

Magnetic bubble domain technology, which is a contender for the mass memory application, unlike the magnetic recording technology, is very flexible in the way the data can be manipulated within the bubble chips. Bubble domains can be switched between different storage tracks and data reordering or reallocation can be readily achieved. These features make it possible to construct a bubble memory with different levels of capacity and access time. In other words, an integrated memory hierarchy can be achieved using magnetic bubble domain technology.

Several methods have been proposed to achieve data reallocation within the bubble chip. One such version is described by C. Tung et al in "Bubble Ladder for Information Processing", IEEE Transaction on Magnetics, Vol. Mag.-11, No. 5, September 1975, P.463. In this version, there is utilized what is called a "Bubble Ladder" which is composed of a large storage loop which can be selectively divided into two or more sub-loops by using crossover switches. Thus, data reallocation can be achieved by properly controlling the operation of the switches relative to the information in the loop.

Also, Bonyhard et al, "Dynamic Data Reallocation in Bubble Memories", BSTJ, Vol. 52, page 307 (1973), describes the use of a new circuit configuration. In this latter version, a bit (bubble) can be inserted or removed without leaving a gap in the storage loop as a function of the direction of the field sense of rotation. Bubble permutation and, thus, reallocation of data can thus be performed.

U.S. Pat. No. 3,701,132, Dynamic Reallocation of Information on Serial Storage Arrangements, Bonyhard et al, further describes a bubble domain mass memory of the major/minor loop configuration which is adapted for the reordering of stored information depending upon the recent use of the information.

Other methods of rearranging or reallocating bubble domain information in storage loops are known. However, alternative methods of reallocating bubble domain information to permit improved operation of the memory are desirable. In addition, it is desirable to provide circuit components which enhance the performance of this type of apparatus.

SUMMARY OF THE INVENTION

The invention provides a magnetic bubble domain circuit component in the nature of an active switch which is used to selectively transfer a bubble from a storage track, hold it for any number of cycles, and then transfer the bubble to another track. The switch, as implemented, includes portions of the respective tracks and an intermediate portion for permitting the bubble to be selectively held thereat. Suitable conductors are provide to control the operation of the switch. The switch can be fabricated as a one-or-two-level component.

In addition, utilization of the switch with suitable magnetic bubble domain memory structures and apparatus permits magnetic bubble domain memory systems to be provided. These systems provide greater reliability, greater information throughput and the like.

DESCRIPTION OF THE PREFERRED EMBODIMENTS

Figure 1:
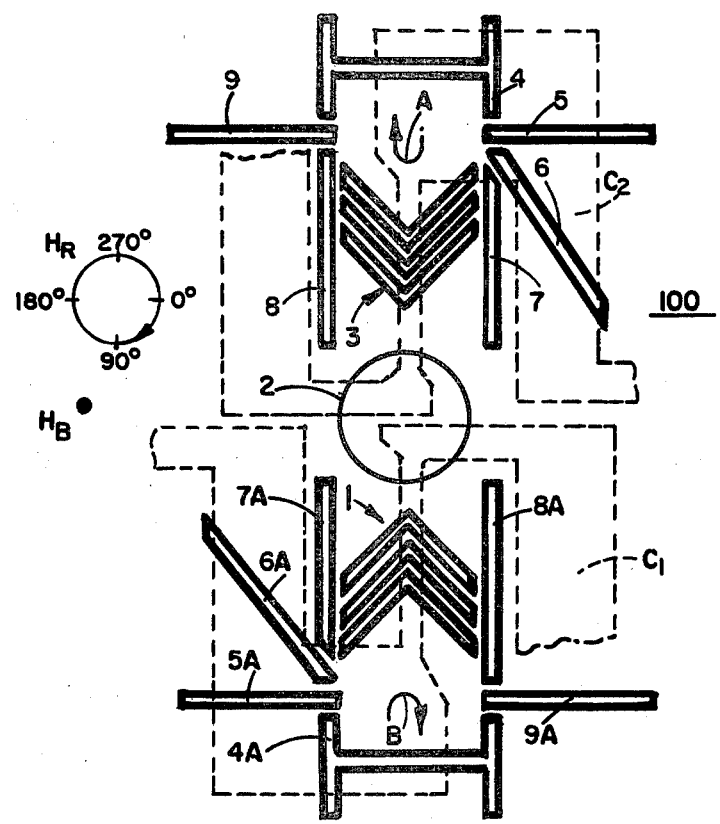
FIG. 1 shows one embodiment of the switch of the instant invention.

Referring now to FIG. 1, there is shown a transfer-hold-transfer switch 100 which forms one embodiment of the instant invention. Switch 100, which can be called a tandem or idler switch, comprises, basically, chevron columns 1 and 3 along with disc 2. Elements 1, 2 and 3 are, typically, fabricated of permalloy or a magnetic bubble domain sheet (not shown) as is known in the art. Chevron columns 1 and 3 each comprise three chevron elements although other numbers thereof may be utilized. The apices of the chevrons are directed toward each other and toward disc 2 which is disposed between the chevron columns. Elements 4 through 9 and 4A through 9A represent portions of the propagation paths with which transfer switch 100 is associated. In addition, conductors C1 and C2 are arranged to provide control signals to the transfer switch. Each of the conductors C1 and C2 comprises a relatively wide conductor portion which has no effect on the other portion of the device and a relatively narrow portion adjacent the apices of chevron columns 1 and 3, respectively. The conductors assist in the transfer of magnetic bubble domains through the switch.

At this point, reference is made to the article "Progress in All-Permalloy Bubble Control Functions", by T. J. Nelson, AIP Conference Proceedings, No. 18, Part 5, pages 95-99 (1974) for the teachings therein. This publication describes an all-permalloy transfer gate having a pair of oppositely directed chevron columns interconnected by a conductor which interconnects the apices of each of the chevrons. The single-level device shown in the Nelson paper describes the operation of that device. The Nelson device is capable of either transfer or replication of signals from one chevron column to the other in response to the application of a control signal in the single control conductor.

Referring again to FIG. 1, it is assumed that bubbles propagate through the respective paths 4, 5, 6, and so forth as well as 4A, 5A, 6A and so forth, in the usual manner under control of rotating field, $H_R$. Thus, chevron columns 1 and 3 form portions of the respective propagation paths. The bubbles in the respective paths propagate in the directions suggested by the arrows A and B, respectively.

In the event that it is now desired to transfer a bubble from one path to the other, the bubble propagating through either path, for example the path designated by arrow A, propagates from elements 4, 5, 6 and 7, to the right end of the chevrons in chevron column 3. As the field $H_R$ rotates from the 0° position toward the 90° position, the bubbles tend to move toward the apices of the chevrons in column 3. However, at approximately the 90° position of $H_R$, a suitable control signal is supplied to conductor C2 to provide a blocking field relative to chevron column 3. Thus, the bubble on the right ends of column 3 is blocked from achieving the apices thereof. However, the field produced on conductor C2 causes the bubble to be further stretched from chevron column 3 toward disc 2. As field $H_R$ continues to rotate, the bubble transfers to disc 2. When field $H_R$ achieves approximately the 270° position, the signal on conductor C2 is terminated. At this point, the pole at disc 2 is sufficiently strong to attract the bubble from chevron column 3 wherein the bubble is now "captured" by disc 2 and circulates therearound in response to field $H_R$. The bubble has now been transferred from chevron column 3 whereby a "space" is transferred through elements 8, 9 and so forth.

Assuming that no additional signals are supplied to the conductors, the bubble now propagates around the periphery of disc 2 in synchronism with field $H_R$. Likewise, other bubbles propagating along the paths indicated by arrows A and B continue to propagate in response to field $H_R$. Thus, it is seen that a single bubble has been removed from the bubble train in path A and has been "stored" on disc 2. The bubble on disc 2 will continue to rotate therearound in the absence of any further activity.

In a similar fashion, a bubble can be replicated from chevron column 3 in path A onto disc 2. The replication is accomplished by the appropriate signal to conductor C2. The signal consists of a double current pulse. The first pulse is applied as the drive field $H_R$ reaches the 90° position. The pulse polarity is such that the bubble stretches between chevron column 3 and disc 2. As the field $H_R$ rotates further, the bubble strip stretches diagonally between these two elements until, at approximately the 270° position, a second current pulse is applied to cut the bubble strip into two parts. One part continues propagating in path A as the original bubble and the second part rotates around disc 2 in synchronism with the drive field $H_R$.

In order to utilize the bubble on disc 2, a control signal is now supplied to conductors C1 and/or C2. In the case of a signal supplied to conductor C1, the signal is supplied at about the 90° angle of $H_R$ to block the pulse rotating around disc 2. Again, the field supplied by the current on conductor C1 blocks the bubble on disc 2 at the right side of the conductor C1. The bubble transfers to chevron column 1 when the field $H_R$ achieves approximately the 270° position. In this instance, magnetic field $H_R$ will then create poles at elements 8A, 9A and so forth to propagate the bubble from chevron column 1 through the remainder of the propagation path indicated by arrow B.

While propagation from path A to path B via disc 2 is described, propagation in either direction can occur. In addition, it is possible to transfer or exchange bubbles from one path to the other substantially simultaneously.

Figure 2:
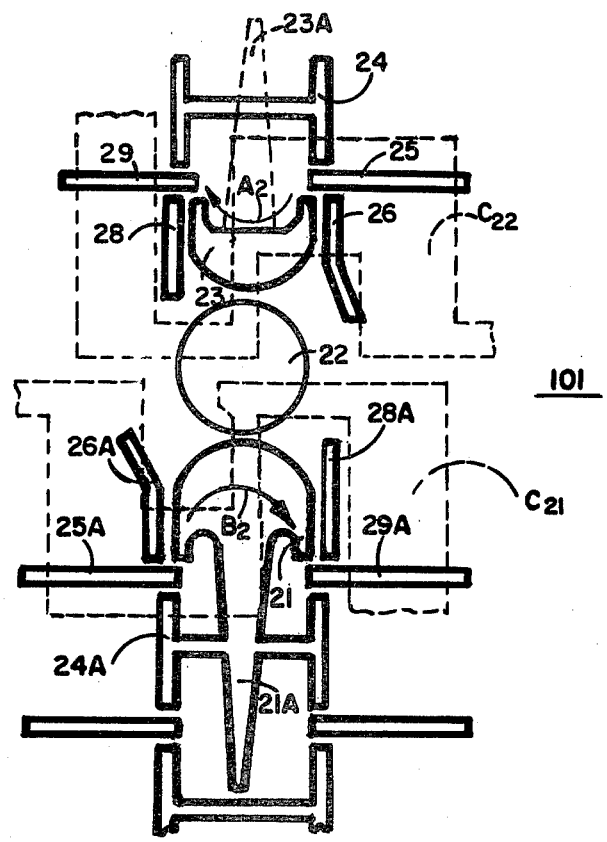
FIG. 2 shows another embodiment of the switch of the instant invention.

Referring now to FIG. 2, there is shown another embodiment of the instant invention. In this embodiment, switch 101 uses elements referred to as the "half-disc" or "pick-ax" elements.

Thus, disc 22 is disposed between two of the elements similar to those described supra. For example, element 21 is shown as a so-called pick-ax element. On the other hand, element 23 is shown as a half-disc element. An elongated bar portion 23A is shown in dashed outline to suggest the outline of another pick-ax element. Both the half-disc or pick-ax elements are known in the art. Typically, in the embodiment shown in FIG. 2, the half-disc element 23 provides suitable operation. Disc 22 can be used with a pair of half-discs, a pair of pick-axs or a combination of both. Conductors C21 and C22 are provided along the lines of conductors C1 and C2 of FIG. 1.

Bubbles propagate through the paths indicated by arrows A2 or B2 in the normal fashion in the absence of applied signals at either of conductors C21 or C22. Thus, bubbles propagating through path A2 propagate through elements 24, 25, 26, 23, 28, 29 and so forth. Likewise, bubbles propagating along path B2 propagate from element 24A to elements 25A, 26A, 21, 28A through 29A and so forth. The configurations of elements 26, 26A, 28 and 28A are desirable for optimum performance but are not required.

As described relative to FIG. 1, with the application of a control signal on conductor C21, a bubble is transferred from element 21 to disc 22 or vice versa. Also, application of the signal on conductor C22 will permit the transfer of a bubble from disc 22 to element 23 and vice versa. Consequently, a bubble can be transferred from either element 21 or element 23 to disc 22 and stored thereon. The bubble transferred to disc 22 will continue to rotate around the periphery thereof in response to rotating field $H_R$ until an appropriate transition is effected in response to a control signal on conductors C21 or C22, respectively.

In summary, the devices shown in FIGS. 1 and 2 provide switches which transfer or replicate a bubble from a first track (storage), hold the bubble for any number of cycles of $H_R$ and then transfer to a second track (I/O track). A bubble located in the chevron or half-disc element can be transferred or replicated to the disc by applying appropriate current pulse(s) in the control conductor. This type of switching operations is generally described in Nelson supra, and in the co-pending application entitled Compact Transfer Replicate Switch for Magnetic Single Wall Domain Propagation Circuits and Method Making Same, by Gergis, bearing Ser. No. 628,293, filed on Nov. 3, 1975, now U.S. Pat. No. 4,079,359 and assigned to the common assignee.

The bubble, after having been transferred, remains on the disc and circulates therearound for any number of cycles of $H_R$. Transfer of the bubble from the disc to the other chevron column (or half-disc) element can be accomplished by applying the appropriate current pulse to the other control conductor. The second transfer can be made as soon as one cycle after the first transfer. Thus, the switch is capable of transferring a bubble from any arbitrary position in the first track to any other arbitrary position in the second track in the shortest possible time, excluding reversing the drive field sense of rotation. Furthermore, the bubble can also be returned to the first track at a different location in the bubble stream so that reallocation can be accomplished.

Figure 3:
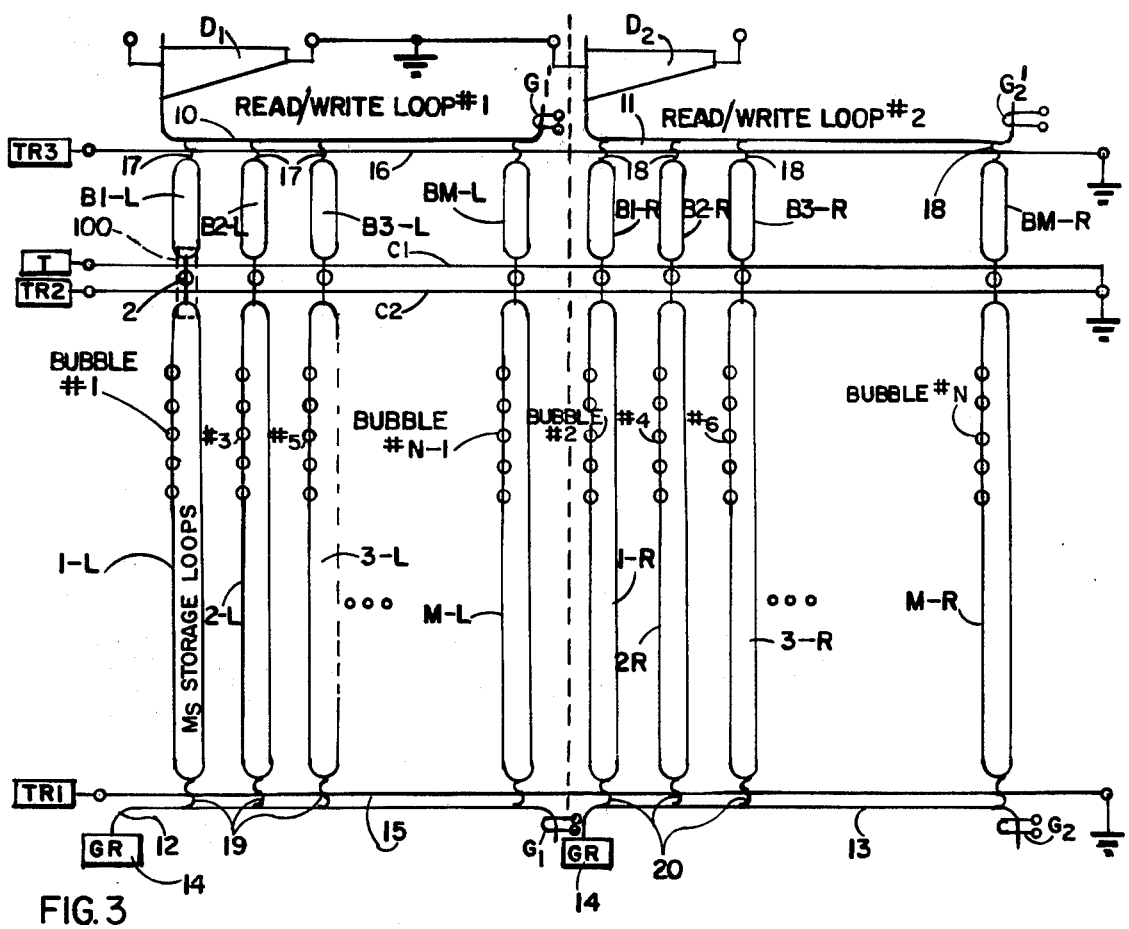
FIGS. 3 and 4 represent bubble domain memory systems utilizing the inventions shown in FIGS. 1 and 2.

Referring now to FIG. 3, there is shown a magnetic bubble domain memory device or system using the buffered minor loop organization. The magnetic memory device comprises a plurality of storage loops 1-L through M-L as well as 1-R through M-R. The total number of loops involved may be any desired number with a minimum of two loops, one having a suffix L and the other having a suffix R. The suffix, in this description, refers to the left or right side of the memory as shown.

Each of the storage loops comprises a suitable propagation path or track formed of any appropriate propagation path devices which are known in the art. That is, the propagation paths may comprise suitable bubble domain device structures such as chevrons, T-bars, H-bars, I-bars or the like as well as combinations thereof. Moreover, each storage loop (or buffer loop) may comprise a plurality of loops or paths arranged for interaction.

Each of the storage loops is coupled to a transfer switch 19 or 20. The transfer switches 19 or 20 are well known in the art and include "pick-ax" switches or any other active transfer/replicate switches known in the art. Transfer switches 19 or 20 are coupled to write/erase loops 12 and 13, respectively. Write/erase loops 12 and 13 may be connected to any suitable dump such as guardrail 14. Inclusion of guardrail 14 is not essential but provides an improved arrangement. Transfer switches 19 and 20 are associated with common conductor 15 (if necessary) which is connected to receive transfer signal TR1 from the appropriate signal source.

In addition, write/erase loops 12 and 13 may be connected to suitable generators G1 and G2, respectively. Generators G1 and G2 may be any suitable generator such as, but not limited to, loop generators which are known in the art. In this arrangement, loops 12 and 13 can be used to write information into storage loops 1-L through M-L and 1-R through M-R via transfer switches 19 and 20, respectively. As will be discussed hereinafter, this arrangement provides an alternative input system for the memory device.

Transfer/replicate switches 17 and 18 are coupled to access loops 10 and 11, respectively. Access (transfer) loop 11 includes a suitable generator G1' of any suitable configuration such as a loop generator. A similar generator, G2', is associated with access loop 10. While the conductor loops of generators G1' and G2' are shown connected separately, they can be connected in series with each other and arranged to receive a common signal from an appropriate source wherein bubbles can be generated in a known fashion.

The ends of access loops 10 and 11 are connected to detectors D1 and D2, respectively. Detectors D1 and D2, shown schematically, can be any suitable type of stretcher detector, many of which are known in the art. Detectors D1 and D2 are preferably, but not necessarily, connected together in a common bridge network (not shown) wherein the full data output of the memory device is retrieved.

In the particular system described herein, it is important that the arrangements between the respective generators and detectors be provided. It is clear that the generator on one side of the device, e.g. generator G2', is located one period closer to the associated switches 18 than the other generator, i.e. G1', is to the associated switches 17. In addition, the detector on the first mentioned side, in this case detector D2, is one period further away from the associated switches, i.e. switches 18, than the detector on the other side, viz. detector D1 relative to switches 17. Of course, other detection schemes or arrangements can be utilized.

Also connected to transfer switches 17 and 18 are buffer loops B1-L, B2-L . . . B1-R, B2-R, and so forth. There is one buffer loop associated with each storage loop in the memory device. These buffer loops may comprise any number and configuraton of device structures such as chevrons, T-bars, H-bars and so forth in the same manner as the storage loops. Connected between each buffer loop and the associated storage loop is a transfer switch 100. Transfer switch 100 is of the type shown and described supra relative to FIG. 1. Of course, transfer switch 101, as shown and described relative to FIG. 2, can be inserted in lieu of switch 100 in FIG. 3. Transfer switch 100 is associated with conductors T and TR2. By appropriately applying the signals to conductors which are the counterparts of conductors C1 and C2 (or C21 or C22) of the foregoing description, the operation of the transfer switches can be controlled.

The basic operation of the memory follows standard routines. For example, it is initially assumed that the memory device is clear. In order to generate a bubble, the magnetic fields $H_B$ and $H_R$ are applied in the appropriate directions. A signal is applied by the generator source to the generator conductor. This signal, when applied at the appropriate time, causes a bubble to be established in each of access loops 10 and 11 as a result of operations at generators G1' and G2' or in write/erase loops 12 and 13 as a result of operations at generators G1 and G2. Under the influence of the applied fields, the bubbles propagate along access loops 10 and 11 (or write/erase loops 12 and 13) in typical fashion. In order to store bubbles in the appropriate storage loops, a signal is supplied to line 16 by source TR3 which activates the replicate/transfer switches 17 and 18. Conversely, a signal can be applied to line 15 by source TR1 to activate replicate/transfer switches 19 and 20. If the split field approach is used as described in copending application Ser. No. 633,306, one of the bubbles is transferred into the appropriate storage loop. This transfer is direct (path 12) or via buffer loops B1-L, etc. The second bubble propagates through the access loop and out of the active device area through the guardrail detector. In this fashion, a number of data bits equal to N, when written in both the access loops 10 and 11 (or 12 and 13), will be transferred into the storage loops—one bit each. Thus, the first bit is transferred to storage loop 1-L, the second bit is transferred into loop 1-R, the third bit is in loop 2-L, and so on.

To read the data stored in the storage loops, the bubbles are propagated around the storage loops under the influence of the applied magnetic fields. A portion of the data stored in the storage loops can be replicated through the tandem switches and transferred into the buffer loops. At the appropriate time, the proper signal is supplied by source TR3 to conductor 16 to render switches 17 and 18 operative to replicate bubbles from the buffer loops to the respective access loops 10 or 11, thence to detectors D1 and D2, respectively. In addition, with the application of the appropriate signal to conductor 15 by source TR1, transfer switches 19 and 20 are activated, thus, the contents of the storage loops are transferred to erase loops 12 and 13 and propagated to guardrail 14 where the bubbles are dissipated.

However, using the specified arrangement of generators and detectors relative to the switches, improved operation of the device is achieved as described in copending application Ser. No. 633,306, now U.S. Pat. No. 4,075,611 which is incorporated herein by reference. The major-minor loop organization (and its modifications) basically consists of a group of closely spaced re-entrant storage loops (minor loops). Each storage loop, e.g. 1-L, is terminated at one end (or both) by a switch, e.g. switch 17, (transfer, replicate or transfer/replicate). These switches connect the minor loops to the major loop(s) which deliver bubbles to and from the output and input ports of the device. To provide a buffering scheme, a small buffer loop, e.g. loop B1-L, is used to interface between each minor loop, e.g. loop 1-L, and the associated access loop 10 as shown schematically in FIG. 3. The minor (storage) loops are connected to the buffer loops by tandem switches such as those described supra. The function of the tandem switches is to transfer or replicate the bubble out of the minor loop to the associated disc and then to transfer the bubble from the disc to the buffer loop. The buffer loop, in turn, is connected to the access loop through switch 17.

The organization depicted in FIG. 3, includes the split field organization of U.S. Pat. No. 4,075,611 which offers not only the advantages described therein, but also results in reducing the minimum block size by a factor of 2. This, of course, means an improvement in the access time to any portion of the data (bit access time).

The possible modes of operation of the buffered-minor-loop organization are numerous. For example, blocks of data can be transferred or replicated out of the minor loops into the buffer loops. In this instance bubbles are replicated out of the buffer loop during reading and transferred out only when a block of data becomes the oldest in the buffer and is replaced by a new block. Of course, the transferred-out block still has its replica in the storage loops. Individual bubbles can be replicated or transferred to and from a closed access loop. If bubbles are replicated out of the storage loop into the buffer loop, no data reallocation takes place within the storage loops. Erasing and writing can be performed through the buffer loop or through another set of switches connecting the other side of the storage loops to the write/erase loops.

In typical operation, when a block of data is called, a search is made by the associated control electronics (not shown) to see whether this block has a replica in the buffer loops or not. If the replica exists in the buffer loops, the bubbles are simply replicated out to the major loop and transmitted to the detector with an average block access time of:

$$Y_B = m_b/2 + n_d$$

Where $m_b$ is the size of the buffer loop and $n_d$ is the distance between the first buffer loop, e.g. loop B1-L, and the detector, i.e. detector delay.

If the data block exists only in the storage loop (i.e. not in the buffer loop), the block of bubbles is replicated into tandem switches 100 and held there. Also, the oldest data block in the buffer loops is erased by transferring the bubbles out to the major loop. These operations can take place in any sequence or concurrently. The vacant block is propagated around the buffer loops, perhaps several times, depending upon how long the new block of data has to travel in the storage loops to reach the tandem switches. When the vacant block reaches the tandem switches, the new block is transferred in from the idling discs in switches 100. Bubbles are then propagated half way around the buffer loop to the transfer/replicate switches where they are replicated out to the major loop. The new block is now stored in the buffer as well as in the storage loops and can be accessed again in a relatively short time compared to the time to travel around the minor loop. The average access time for a block not stored in the buffer is:

$$\tau_A = \frac{n_s}{2} + n_b + n_d,$$

where $n_s$ is the number of bits in each storage loop, $n_b$ is the number of bits in each buffer loop, and $n_d$ is the distance (bit count) between the first switch in the read loop and the detector.

$$\tau_{AV} = h\left(\frac{n_b}{2} + n_d\right) + (1 - h)\left(\frac{n_s}{2} + n_b + n_d\right)$$

$$\tau_{AV} = n_d + n_b\left(1 - \frac{h}{2}\right) + (1 - h)\frac{n_s}{2}$$

with h near 1 and $n_s >> n_b$, it is seen that the access time is much shorter than $$\tau_A = \frac{n_s}{2} + n_d,$$

which is the access time in an unbuffered organization.

The access time to a bit is equal to the average access time for a block plus one half the number of bits in a block (for consecutive bit blocks). In the organization shown, this amounts to $Y_b = (n_s/4)$ inasmuch as the block size for a square chip is $n_s/2$. The access time to any portion of data might well be dominated by the length of the block. To avoid this, the block size can be reduced even further by using higher orders of parallel multiplexing such as 4-plexing wherein the chip is divided into four sub-fields and the block size is reduced by another factor of 2.

Figure 4:
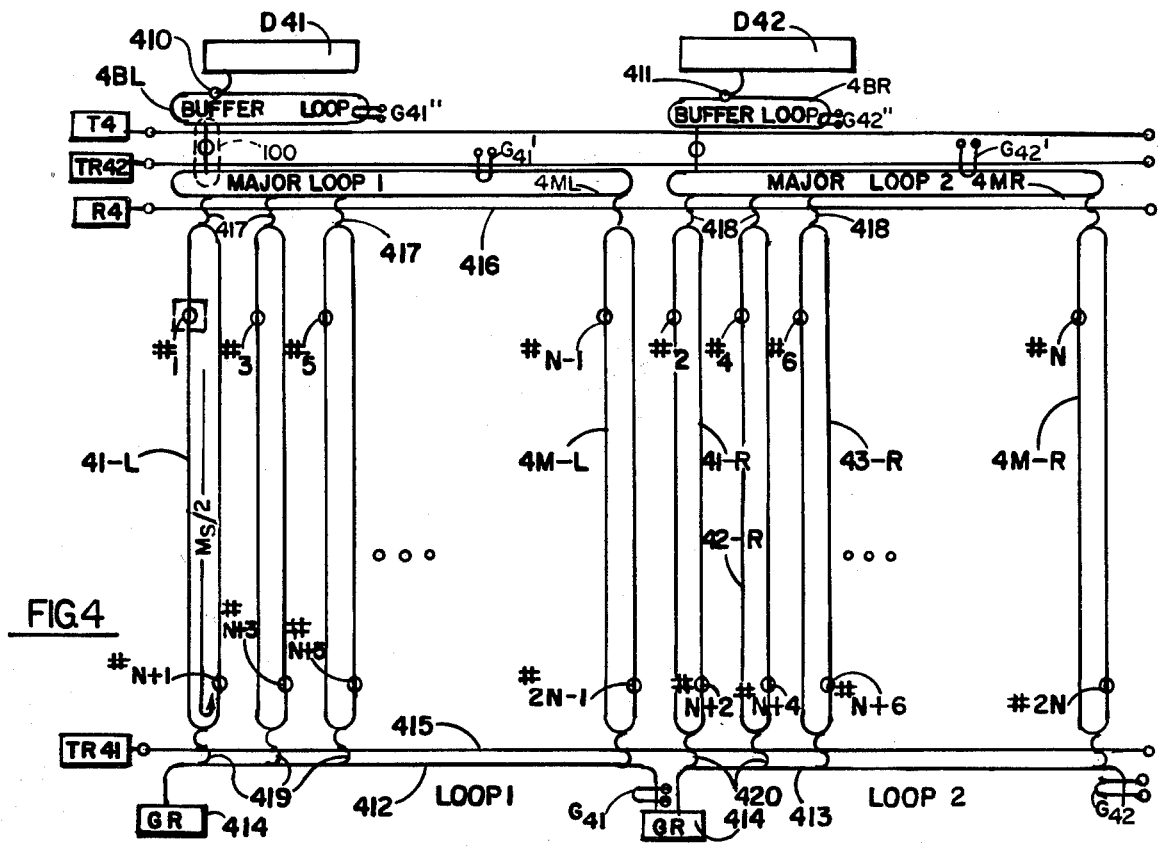

Referring now to FIG. 4, there is shown the major loop buffer organization of a bubble domain memory device. In this embodiment, elements which are similar to elements in FIG. 3 bear similar reference numerals but with the prefix 4. Again, a plurality of storage loops 41-L, 42-L through 4M-L as well as 41-R, 42-R through to 4M-R are provided. One end of the storage loops is connected to write/erase loop 412 or 413 via transfer/replicate switches 419 and 420, respectively. Loops 412 and 413 include a generator G41 or G42, respectively. In addition, each of loops 412 and 413 is connected to guard rail 414. Transfer/replicate switches 419 and 420 are selectively operated by application of signal TR41 along line 415.

At the other end, each of the storage loops is connected to one of replicate switches 417 or 418 which are selectively controlled by the application of the replicate signal R along line 416. Each of replicate switches 417 is also coupled to major loop 4ML while replicate switches 418 are connected to major loop 4MR. This major/minor loop operation is similar to that known in the art. Generators G41' and G42' are associated with major loops 4ML and 4MR, respectively. These generators are optional arrangements in view of the write/erase loops 412 and 413. That is, generators G41′ and G42′ can be used in lieu of or in addition to generators G41 and G42.

Buffer loops 4BL and 4BR are provided adjacent to major loops 4ML and 4MR, respectively. Tandem switches 100 are interconnected between each of the associated pairs of buffer and major loops. Tandem switch 100 may be either of the switches 100 and 101 shown and described relative to FIGS. 1 and 2, respectively. Tandem switches 100 are controlled by the selective application of signals TR42 and T4 to control the operation thereof. Passive replicators 410 and 411 are associated with each of the buffer loops 4BL and 4BR, respectively. The information propagating around the buffer loops is replicated by the associated replicator and provided to the associated detector D41 or D42, respectively. In addition, optional generators G41″ and G42″ are shown associated with the buffer loops. These generators may be utilized in addition to, or in lieu of, any of the other generators previously described.

The buffering is provided by inserting a small buffer loop between the detector and the associated major loop. A closed access loop (e.g. 4MR, 4ML) is used inasmuch as accessing of different blocks involves propagating bubbles around the major loop. Data return to the storage loop might not be necessary. However, if desired, replicate switches are used between the storage loops and the major loop. The information pages are accessed to the major loop either in the form of consecutive bits by replicating or transferring bubbles in two consecutive cycles, or by transferring only one bubble from each storage loop and using two major loops to provide for consecutive bit access (similar to the split-field chip organization described relative to FIG. 3).

To fully populate the major loops, one-half of the page is accessed in one step. The block is propagated half-way around the major loop until the T/R switches are clear and the other half of the page is replicated out.

Again, numerous modes of operation of this chip are possible. However, the most typical operation is that bubbles are replicated out of the minor loops to the major loops. Bubbles are then transferred out of the major loop to the buffer loops. Erasing and writing of new data is performed at the other end of the storage loops through the transfer switches which connect the storage loop to the write/erase tracks. In detection, bubbles are replicated out of the buffer loop to the detector through a passive replicator. In order to provide large blocks of information, it may be desirable to provide $n_{block}/2$ chips (of the type suggested in FIG. 4) arranged in parallel.

Thus, in typical operation of the chip, if the required block of data is already in the buffer, access is made by propagating the bubbles till the replicated block reaches the detector. The average access time $Y_A$ for a block already in the buffer is $$\tau_A = \frac{n_b}{2} + n_d$$

where $n_b$ is the number or bits in the buffer loop, and where $n_d$ is the detector delay measured from the tandem switch position.

If the required block is in the major loop, the oldest block in the buffer is first returned through the tandem switch to its original position in the major loop. Then the new block is transferred, also through the tandem switch, into the void left by the newly evacuated block in the buffer, and then replicated into the detector as noted supra. The average access time for such a process is $$\tau_A = (\frac{m_b}{2} + \frac{N_m}{2}) + (\frac{N_m}{2} + \frac{m_b}{2}) + n_d$$

or $$\tau_A = (n_b + N_m + n_d)$$

where $N_m$ is the bit capacity of the major loop.

For a block stored in the minor loops, the storage access time is increased further by $n_s/2$ (half the minor loop size). Assuming the possibility that the required block is in the buffer, major loop, and minor loops to be $h_b$, $h_m$, $h_s$ ($h_b+h_m+h_s=1$), the average access time is $$\tau = h_b(\frac{n_b}{2} + n_d) + h_m(n_b + N_m + n_d) +$$
$$h_s(n_b + N_m + \frac{n_s}{2} + n_d)$$
$$\tau = \frac{n_b}{2} + h_m(\frac{n_b}{2} + N_m) + h_s(\frac{n_b}{2} + N_m + \frac{n_s}{2}) + n_d$$

If $h_m <\!< 1$ it is seen that the average access time is much shorter than that of the unbuffered organization. It is also to be noted that it takes only two cycles to access one block. Thus, the average access time to any portion of data is $Y+1$, i.e., basically the same as the block access time Y.

Thus, there has been shown and described a new idler or tandem switch and related chip organization which permits transfer of a bubble from any position in a storage loop to any other arbitrary position in a buffer loop. This type of transfer permits reallocation of data in the shortest possible time—excluding reversing the direction of the rotation of drive field. It has been shown that the application of the integrated buffer scheme can be made within either the minor loops or the major loops. The major loop integration offers the shortest access time at the expense of higher power consumption. The minor loop integration permits lower power consumption but somewhat higher access time. Although not described in detail, it should be understood that parallel multiplexing of the circuits shown in FIGS. 3 and 4 provides another modification that can further reduce the minimum block size and, consequently, the access time to a portion of data stored in the storage loops.

It is clear that this description is illustrative only and is not intended to be limitative of the invention. Those skilled in the art may conceive modifications or alterations to the configurations illustrated. For example, the minor loops in either of the system configurations can be comprised of a plurality of small, interconnected loops. Any modifications which fall within the purview of this description are intended to be included therein as well. The scope of the description is limited only by the claims appended hereto.

Having thus described the preferred embodiment of the invention, what is claimed is:

1. A magnetic bubble domain device comprising,
a plurality of adjacent propagation patterns which form portions of at least two independent propagation paths,
a recirculating pattern interposed between but separate from said adjacent propagation patterns, said recirculating pattern comprises a single distinct element, and conductor means associated with each of said propagation patterns and said recirculating pattern to selectively cause magnetic bubble domains to be transferred between the adjacent propagation patterns and said recirculating pattern in either direction.

2. The device recited in claim 1 wherein
said recirculating pattern is arranged to operate on only one magnetic bubble domain at a time.

3. The device recited in claim 1 wherein
said adjacent propagation patterns comprise columns of of chevron elements.

4. The device recited in claim 1 wherein
said adjacent propagation patterns include at least one half-disc element.

5. The device recited in claim 1 wherein
said adjacent propagation patterns include at least one pick-ax element.

6. The device recited in claim 1 wherein
said conductor means includes two separate conductors, each separate conductor associated with said recirculating pattern and one of said adjacent propagation patterns.

7. The device recited in claim 1 wherein
said conductor means and each of said propagation patterns is formed as a separate level.

8. The device recited in claim 1 wherein
said two propagation paths comprise a storage loop and a buffer loop respectively.

9. The device recited in claim 8 including
a plurality of storage loops and a plurality of buffer loops respectively coupled to each other, and an output access path coupled to each of said buffer loops.

10. The device recited in claim 9 including
input means selectively coupled to each of said storage loops.

11. The device recited in claim 9 wherein
said storage loops and said buffer loops are selectively connected in series via the respective recirculating patterns thereby to provide parallel outputs to said output access path.

12. The device recited in claim 8 wherein
said buffer loop has less capacity than said storage loop and is arranged to store information therein which is a duplicate of information in said storage loop whereby ready access to the information is achieved via said buffer loop.

13. The device recited in claim 12 wherein
the information stored in said buffer loop is readily interchanged with the information in said storage loop whereby the most recently accessed information is retained in said buffer loop.

14. The device recited in claim 1 wherein
said two propagation paths comprise a major access loop and a buffer loop, respectively, and a plurality of storage loop, selectively coupled to said major access loop.

15. The device recited in claim 14 wherein
said major access loop receives information in parallel from said storage loops, said buffer loop receives information in series from said major access loop.

16. The device recited in claim 1 including
source means for supplying control signals to said conductor means to control the transfer of magnetic bubble domains.

* * * * *

UNITED STATES PATENT AND TRADEMARK OFFICE
CERTIFICATE OF CORRECTION

PATENT NO. : 4,198,690
DATED : April 15, 1980
INVENTOR(S) : Gergis et al

It is certified that error appears in the above-identified patent and that said Letters Patent are hereby corrected as shown below:

Column 7, line 54 is shown as:

$$Y_B = m_b/2 + n_d$$

Column 7, line 54 should be:

$$T_B = m_b/2 + n_d$$

Signed and Sealed this

Twenty-sixth Day of August 1980

[SEAL]

Attest:

SIDNEY A. DIAMOND

Attesting Officer

Commissioner of Patents and Trademarks